United States Patent
Perzlmaier et al.

(10) Patent No.: US 9,324,615 B2
(45) Date of Patent: Apr. 26, 2016

(54) METHOD FOR PRODUCING A SEMICONDUCTOR BODY

(75) Inventors: Korbinian Perzlmaier, Regensburg (DE); Heribert Zull, Regensburg (DE); Franz Eberhard, Regensburg (DE); Thomas Veit, Mintraching (DE); Mathias Kämpf, Burglengenfeld (DE); Jens Dennemarck, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 31 days.

(21) Appl. No.: 14/111,655

(22) PCT Filed: Apr. 4, 2012

(86) PCT No.: PCT/EP2012/056183
§ 371 (c)(1),
(2), (4) Date: Nov. 21, 2013

(87) PCT Pub. No.: WO2012/139953
PCT Pub. Date: Oct. 18, 2012

(65) Prior Publication Data
US 2014/0080286 A1  Mar. 20, 2014

(30) Foreign Application Priority Data
Apr. 14, 2011 (DE) .......................... 10 2011 017 097

(51) Int. Cl.
*H01L 21/00* (2006.01)
*H01L 21/78* (2006.01)
(Continued)

(52) U.S. Cl.
CPC ............ *H01L 21/78* (2013.01); *H01L 33/0095* (2013.01); *H01L 2924/0002* (2013.01); *H01S 5/0201* (2013.01)

(58) Field of Classification Search
CPC .......................................................... H01L 21/78
USPC ........................................... 438/33, 462, 463
See application file for complete search history.

(56) References Cited

U.S. PATENT DOCUMENTS

| 7,208,337 B2 | 4/2007 | Eisert et al. |
| 2005/0255614 A1* | 11/2005 | Jonda et al. ..................... 438/21 |

(Continued)

FOREIGN PATENT DOCUMENTS

| DE | 10 2010 018 051 A1 | 10/2011 |
| EP | 1 592 070 A2 | 11/2005 |

(Continued)

OTHER PUBLICATIONS

Taiwanese Examination Report dated May 28, 2014 from corresponding Taiwanese Patent Application No. 101112906.

(Continued)

*Primary Examiner* — Bradley K Smith
(74) *Attorney, Agent, or Firm* — DLA Piper LLP (US)

(57) ABSTRACT

A method of producing a semiconductor body includes providing a semiconductor wafer having at least two chip regions and at least one separating region arranged between the chip regions, wherein the semiconductor wafer includes a layer sequence, an outermost layer of which has, at least within the separating region a transmissive layer transmissive to electromagnetic radiation, carrying out at least one of: removing the transmissive layer within the separating region, applying an absorbent layer within the separating region, increasing the absorption coefficient of the transmissive layer within the separating region, and separating the chip regions along the separating regions by a laser.

11 Claims, 3 Drawing Sheets

(51) Int. Cl.
*H01L 33/00* (2010.01)
*H01S 5/02* (2006.01)

(56) References Cited

U.S. PATENT DOCUMENTS

2010/0148198 A1   6/2010  Sugizaki et al.
2010/0264442 A1* 10/2010  Lee ................................ 257/98

FOREIGN PATENT DOCUMENTS

| | | |
|---|---|---|
| EP | 2 197 051 A2 | 6/2010 |
| EP | 2 216 833 A1 | 8/2010 |
| JP | 53-105964 | 9/1978 |
| JP | 54-86265 | 7/1979 |
| JP | 10-44139 | 2/1998 |
| JP | 2003-273473 | 9/2003 |
| JP | 2007-258445 | 10/2007 |
| JP | 2007-324586 | 12/2007 |
| JP | 2008-140872 | 6/2008 |
| JP | 2009-218495 | 9/2009 |
| JP | 2010-272724 | 12/2010 |
| JP | 2012-142508 | 7/2012 |
| KR | 20080061694 A * 7/2008 | .............. H01L 33/02 |

OTHER PUBLICATIONS

English translation of the corresponding Notice of Reasons for Rejection of JP 2014-504255 dated Nov. 4, 2014.

* cited by examiner

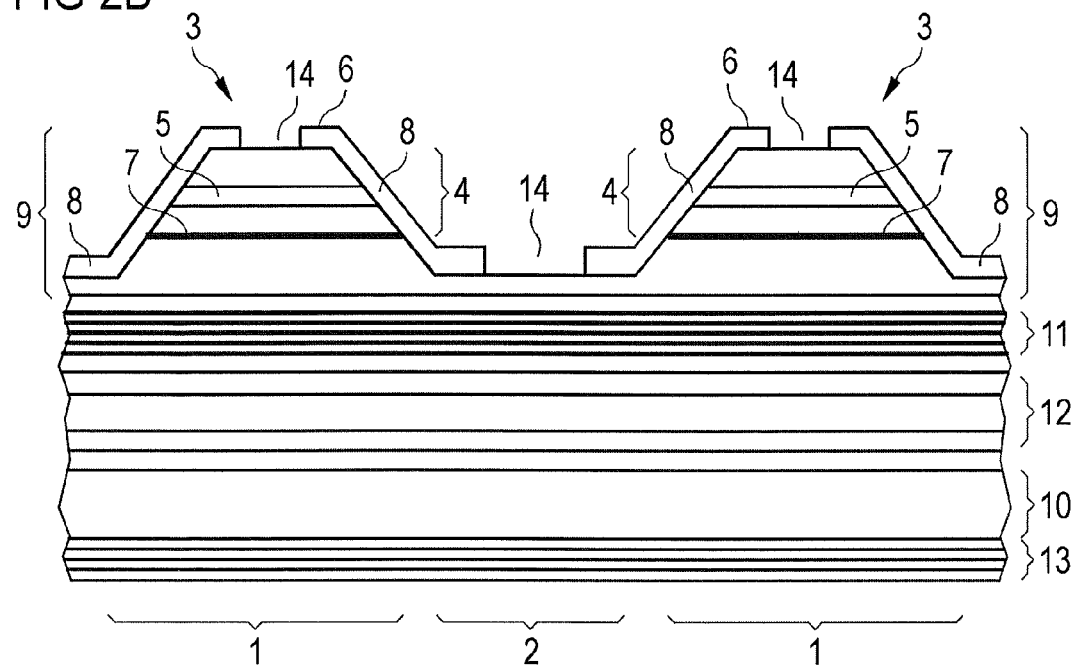
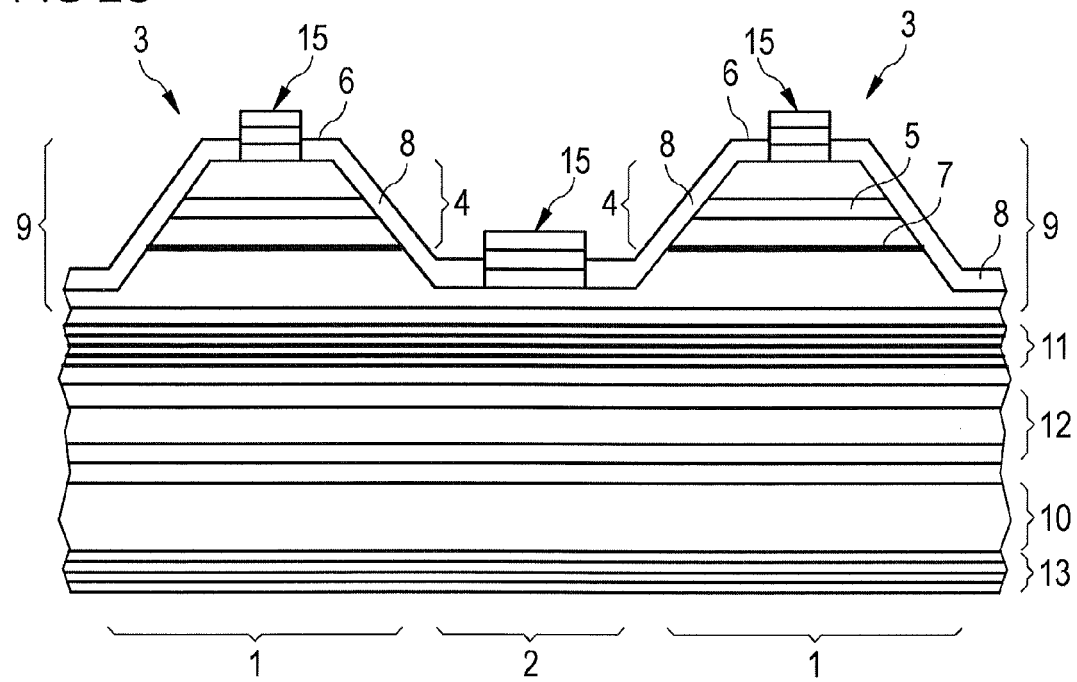

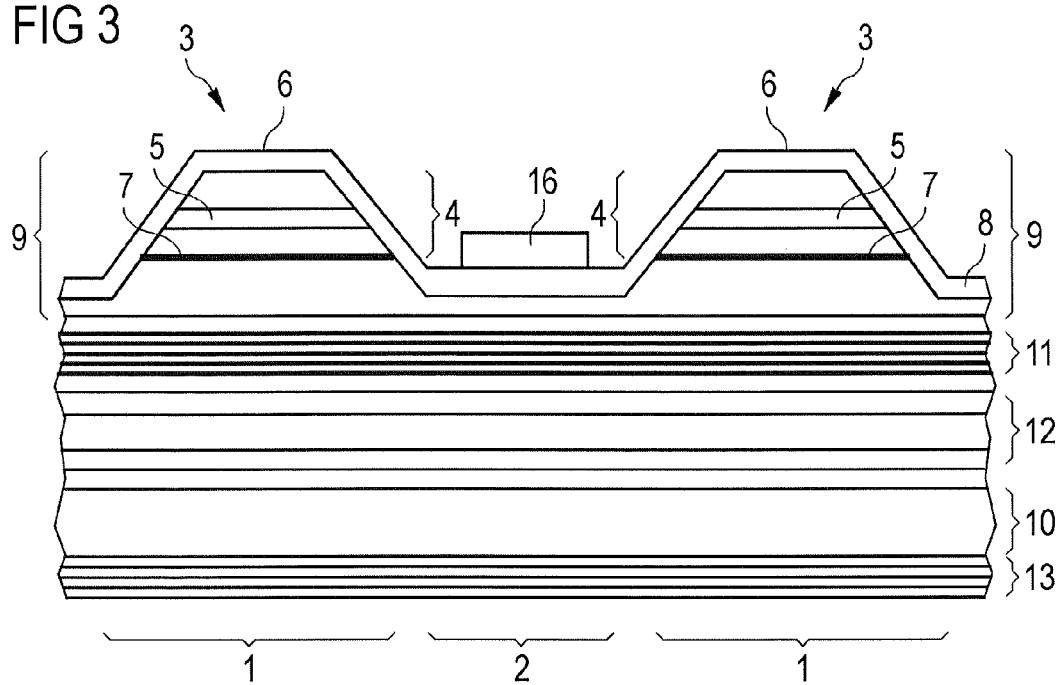
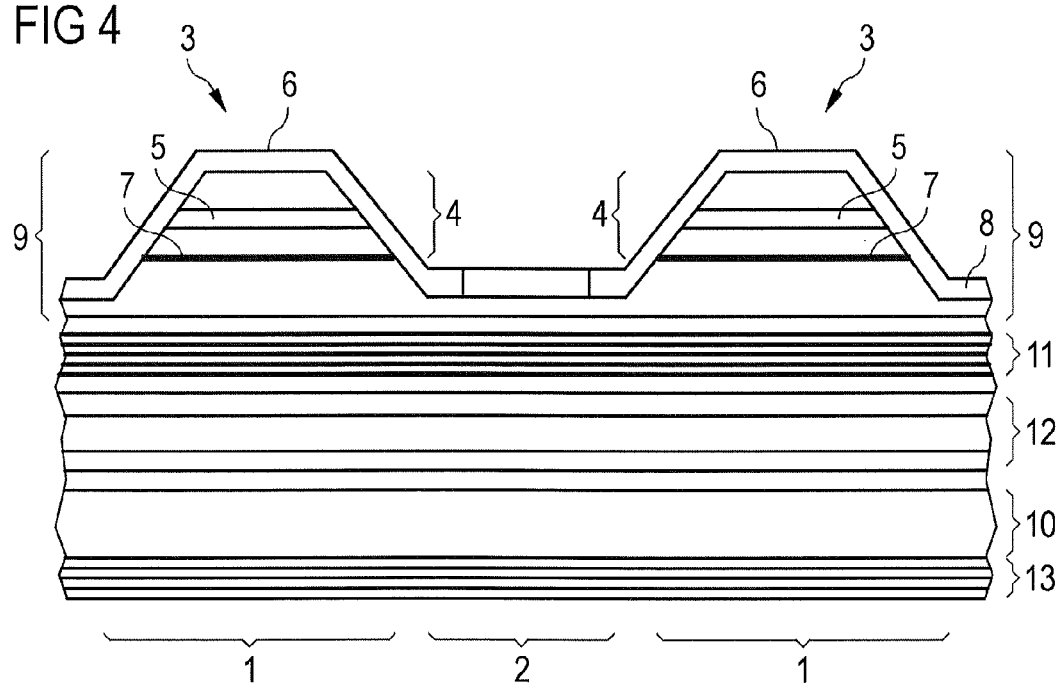

METHOD FOR PRODUCING A SEMICONDUCTOR BODY

TECHNICAL FIELD

This disclosure relates to a method of producing a semiconductor body.

BACKGROUND

There is a need to provide a method of producing a semiconductor body wherein the semiconductor body to be produced is exposed to only a low risk of damage during singulation.

SUMMARY

We provide a method of producing a semiconductor body including providing a semiconductor wafer having at least two chip regions and at least one separating region arranged between the chip regions, wherein the semiconductor wafer includes a layer sequence, an outermost layer of which has, at least within the separating region a transmissive layer transmissive to electromagnetic radiation, carrying out at least one of removing the transmissive layer within the separating region, applying an absorbent layer within the separating region, increasing the absorption coefficient of the transmissive layer within the separating region, and separating the chip regions along the separating regions by a laser.

We also provide a method of producing a semiconductor body including providing a semiconductor wafer having at least two chip regions and at least one separating region arranged between the chip regions, wherein the semiconductor wafer includes a layer sequence, an outermost layer of which has, at least within the separating region a transmissive layer transmissive to electromagnetic radiation, carrying out at least one of removing the transmissive layer within the separating region, applying an absorbent layer within the separating region, wherein the absorbent layer has a melting and/or boiling point higher than the melting and/or boiling point of the transmissive layer, increasing the absorption coefficient of the transmissive layer within the separating region, and separating the chip regions along the separating regions by a laser.

BRIEF DESCRIPTION OF THE DRAWINGS

FIGS. 2A to 2C show schematic sectional illustrations of a semiconductor wafer during different method stages in accordance with a first example.

FIG. 3 shows a schematic sectional illustration of a semiconductor wafer during a method stage in accordance with a further example.

FIG. 4 shows a schematic sectional illustration of a semiconductor wafer during a method stage in accordance with a still further example.

DETAILED DESCRIPTION

Figure 1:
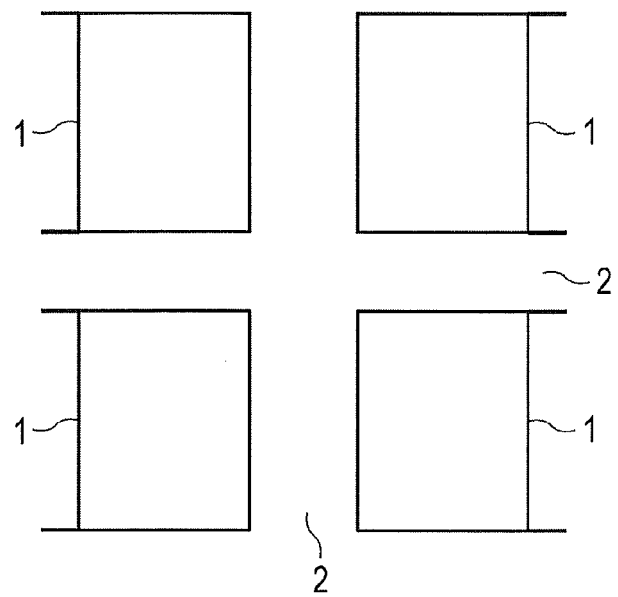
FIG. 1 shows a schematic plan view of a semiconductor wafer in accordance with a first example.

We provide a method of producing a semiconductor body comprising the following steps:
  providing a semiconductor wafer having at least two chip regions and at least one separating region arranged between the chip regions, wherein the semiconductor wafer comprises a layer sequence, the outermost layer of which has, at least within the separating region a transmissive layer that is transmissive to electromagnetic radiation,
  carrying out at least one of the following measures:
    removing the transmissive layer within the separating region,
    applying an absorbent layer within the separating region,
    increasing the absorption coefficient of the transmissive layer within the separating region, and
  separating the chip regions along the separating regions by a laser.

This method affords the advantage that damage to the outermost transmissive layer of the layer sequence during laser separation can be at least reduced. If the separating region has a transmissive layer as the outermost layer, then the electromagnetic radiation of the laser is absorbed only slightly within the transmissive layer such that the transmissive layer itself experiences only a slight separating effect resulting from the laser. In contrast, the material lying below the transmissive layer absorbs the radiation of the laser generally to a significantly greater extent such that the material evaporates and locally bursts the transmissive layer at least in the separating region. In this way, cracks can occur in the transmissive layer. Furthermore, slag which arises during the separating process can reach the chip regions, where it can be removed only with difficulty.

The semiconductor body to be produced can be an optoelectronic semiconductor body, for example.

The separating region can be a sawing trench, for example.

The layer sequence of the optoelectronic semiconductor body may have, within a chip region, an active zone that generates electromagnetic radiation during operation of the semiconductor body. In this case, the separating region particularly preferably completely penetrates through the active zone.

The active zone comprises, for example, a pn junction, a double heterostructure, a single quantum well or a multi-quantum well structure (MQW), to generate radiation. In this case, the designation quantum well structure does not include any indication about the dimensionality of the quantization. It therefore encompasses, inter alia, quantum wells, quantum wires and quantum dots and any combination of these structures.

Particular optoelectronic semiconductor bodies have, for example, for protection of the active zone, a passivation layer as the outermost layer of their layer sequence, which is a transmissive layer. The passivation layer is, for example, comparatively inert with respect to chemical reactions for instance with the surrounding medium such as air. Furthermore, the passivation layer can also be electrically insulating.

The transmissive layer particularly preferably has a transmission coefficient of greater than or equal to 0.9 at least for radiation of the active zone and/or the light emitted by the optoelectronic semiconductor body, generally visible light.

The transmissive layer can, for example, contain one of the following materials or be formed from one of oxides and nitrides.

The thickness of the transmissive layer is preferably 3 nm to 500 nm.

The transmissive layer may cover the side faces of the chip regions at least in the region of the active zone. Particularly preferably, the transmissive layer completely covers the side faces of the chip regions. The active zone can advantageously be protected as a result. An electrically insulating transmissive layer generally also protects the active zone against short circuits.

The transmissive layer may be removed within the separating region by an etching process. The etching process can be dry-chemical or wet-chemical etching, for example.

The transmissive layer may be locally removed in the separating region and in the chip regions such that in each case at least one opening arises in the transmissive layer within the separating region and within the chip regions. Exactly one opening may be produced in the transmissive layer within each chip region and exactly one opening may be produced in the transmissive layer within the separating region. Furthermore, before separating the chip regions, a metallic layer is arranged in the openings of the transmissive layer.

In this case, the metallic layer within the opening on the chip region is preferably provided to make electrical contact with the respective semiconductor body and—if present—the active zone. By applying the metallic layer within the openings of the separating region, it is advantageously possible to generally increase the absorption of laser light within the separating region. Furthermore, in this way, an additional photolithographic step during the production of the semiconductor body is advantageously generally avoided.

The metallic layer can be constructed from different individual layers, wherein at least one individual layer comprises a metal or consists of a metal. Particularly preferably, all of the individual layers comprise a metal or consist of a metal. By way of example, the individual layers can consist of one of the following materials or comprise one of the following materials: titanium, platinum, gold.

Preferably, the metallic layer has a thickness of 3 nm to 5 µm.

If an absorbent layer is arranged on the transmissive layer, then it preferably comprises one of the following materials or consists of one of the following materials: platinum, ruthenium, rhodium, osmium, iridium, zirconium, vanadium, tantalum, chromium, molybdenum, tungsten, carbides, tungsten carbide, titanium carbide, silicon carbide, silicon, nitrides, titanium nitride and tantalum nitride.

Preferably, the absorbent layer has a thickness of 3 nm to 5 µm.

Particularly preferably, the absorbent layer is arranged in direct contact with the transmissive layer such that the transmissive layer and the absorbent layer have a common interface.

Particularly preferably, the absorbent layer has a melting and/or boiling point higher than the melting and/or boiling point of the transmissive layer. In this way, preferably, during the laser separating process, the transmissive layer lying below the absorbent layer can at least partly be concomitantly melted.

Particularly preferably, the absorbent layer has a melting point of at least 1800° C. and/or a boiling point of at least 1800° C.

Preferably, the absorbent layer is locally applied only within the separating region, while the chip regions remain free of the absorbent layer.

A local increase in the absorption coefficient of the transmissive layer within the separating region can be achieved, for example, by one of the following methods: introducing scattering centers into the transmissive layer, implanting dopants into the transmissive layer, wet-chemical modification. A local increase in the absorption coefficient of the transmissive layer itself is also preferably carried out only locally within the separating region, while the transmissive layer within the chip region remains unchanged.

It is possible to produce, for example, an optoelectronic thin-film semiconductor body, for instance a light-emitting diode semiconductor body of thin-film design. In this case, each chip region has at least one thin-film semiconductor body or is formed from a thin-film semiconductor body.

An optoelectronic thin-film semiconductor body is distinguished, in particular, by an epitaxial grown semiconductor layer sequence comprising the active zone suitable to generate radiation or detect radiation, wherein a growth substrate of the epitaxial semiconductor layer sequence was removed or thinned such that by itself it does not mechanically stabilize the epitaxial semiconductor layer sequence to a sufficient extent.

For the purpose of mechanical stabilization, a carrier is arranged on the main face of the epitaxial semiconductor layer sequence situated opposite the growth substrate. The carrier generally comprises a material that differs from the growth substrate of the semiconductor layer sequence. The carrier can, for example, comprise one of the following materials or consist of one of the following materials: germanium and silicon.

Particularly preferably, a reflective layer is arranged between the epitaxial semiconductor layer sequence and the carrier, the reflective layer, during the operation of the semiconductor body, reflecting at least the electromagnetic radiation generated or detected in the active zone thereof. The reflective layer can be a Bragg reflector, for example.

The carrier can be connected to the epitaxial semiconductor layer sequence cohesively, for example, by a solder layer or an adhesive layer. Particularly preferably, the solder layer or the adhesive layer is in this case electrically conductive such that electrically conductive contact can be made with the thin-film semiconductor body later via the rear side thereof. In this case, the rear side of the semiconductor body is situated opposite the radiation passage area thereof.

A suitable solder preferably contains one of the following materials or is formed from one of the following materials or an alloy of these materials: titanium, platinum, gold and tin.

A barrier layer may be arranged between the solder layer and the carrier, the barrier layer serving to at least reduce diffusion of the underlying materials into the active zone.

The barrier layer can be constructed from individual layers, for example. The individual layers can, for example, comprise one of the following materials or consist of one of the following materials: platinum, gold-tin and titanium tungsten nitride.

Metallization may be applied on the rear side of the semiconductor body, the metallization serving to make electrical contact with the semiconductor body. The metallization can be constructed from individual layers. The individual layers of the metallization, for example, comprise one of the following materials or consist of one of the following materials: platinum, gold and titanium.

Further advantages and developments will become apparent from the examples described below in conjunction with the figures.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with an exaggerated size to provide better illustration and/or to afford a better understanding.

The semiconductor wafer in accordance with the example in FIG. 1 has a multiplicity of chip regions 1, between which linear separating regions 2 are arranged in the form of a grid. The separating regions 2 can be sawing trenches, for example.

Each chip region 1 comprises a semiconductor body 3, for example, a light-emitting diode semiconductor body of thin-film design. The chip regions 1 are singulated into separate semiconductor bodies 3 along the separating regions 2, for example, by a laser separating process.

Figure 2A:
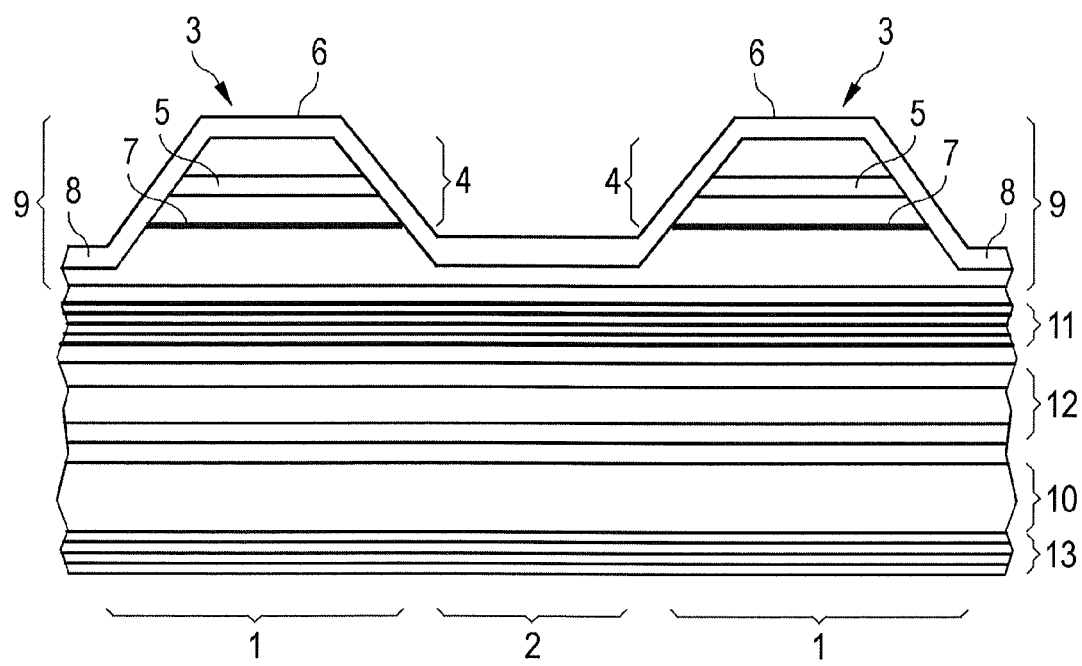

The semiconductor wafer in accordance with the example in FIG. 2A has a plurality of chip regions 1. For reasons of clarity, FIG. 2A illustrates only two adjacent chip regions 1, between which a separating region 2 is arranged. Each chip region 1 has a thin-film semiconductor body 3 provided to generate radiation.

Each thin-film semiconductor body 3 has an epitaxial semiconductor layer sequence 4 comprising an active zone 5 to generate radiation. A reflective layer 7 is arranged on that side of the semiconductor layer sequence 4 facing away from the radiation passage area 6, the reflective layer provided to reflect radiation generated in the active zone 5 during operation of the semiconductor body 3 toward the radiation passage area 6.

A transmissive layer 8 is applied to the radiation passage area 6 of the semiconductor body 3. In this case, the transmissive layer 8 is arranged continuously on the entire surface of the semiconductor wafer. In particular, the side faces 9 of the chip regions 1 are completely covered with the transmissive layer 8.

The transmissive layer 8 can be a passivation layer, for example, which for instance comprises an oxide or a nitride or is formed from an oxide or nitride. The transmissive layer 8 is provided in particular to protect the active zone 5 against external chemical influences and avoid short circuits of the active zone 5.

A carrier 10 is arranged onto that side of the semiconductor layer sequence 4 situated opposite the radiation passage area 6, the carrier provided to mechanically stabilize the semiconductor layer sequence 4. The carrier 10 can be formed from germanium, for example.

In this case, a solder layer 11 is arranged between the semiconductor layer sequence 4 and the carrier 10, the solder layer cohesively connecting the carrier 10 to the semiconductor layer sequence 4. The solder layer 11 can, for example, contain one of the following materials or be formed from one of these materials or an alloy of these materials: gold and tin.

A barrier layer 12 is furthermore arranged between the solder layer 11 and the carrier 10, the barrier layer being constructed from individual layers. The individual layers can, for example, comprise one of the following materials or be formed from one of the following materials: platinum, gold-zinc, titanium and titanium tungsten nitride.

Furthermore, a metallization 13 is applied on the main side of the carrier 10 facing away from the semiconductor layer sequence 4, the metallization provided to make electrical contact with the semiconductor body 3 on the rear side. The metallization 13 can likewise be constructed from individual layers which comprise one of the following materials or are formed from one of the following materials: platinum, gold and titanium.

In a next step, in each case within a chip region 1, an opening 14 is produced in the transmissive layer 8 (FIG. 2B). At the same time, in the separating region 2, too, an opening 14 is produced in the transmissive layer 8. In this case, the openings 14 penetrate through the transmissive layer 8 completely in each case. To locally produce the openings 14 within the regions provided therefor, by way of example, a photopatterning of the surface is performed before the transmissive layer 8 is removed. In this example, it is advantageously possible to produce the openings 14 within the transmissive layer 8 by just a single photopatterning.

In a next step (FIG. 2C) a metallic layer 15 is deposited within the openings 14. In this case, the metallic layer 15 is constructed from three individual layers. In this case, the individual layers, for example, comprise one of the following materials or consist of one of the following materials: titanium, platinum and gold.

The metallic layer 15 within the openings 14 in the chip regions 1 is provided to later make electrical contact with the semiconductor body 3. Within the openings 14 of the separating region 2, the metallic layer 15 absorbs the laser radiation during a later laser separating process such that a better separation takes place.

In the example in accordance with FIG. 3, in contrast to the example in accordance with FIGS. 2A to 2C, no openings 14 are produced in the transmissive layer 8. Rather, proceeding from a semiconductor wafer as already described with reference to FIG. 2A, an absorbent layer 16 is applied locally within the separating region 2. In this case, the absorbent layer 16 is preferably arranged only within the separating region 2, while the chip regions 1 remain free of the absorbent layer 16. In this case, the absorbent layer 16 is arranged in direct contact with the transmissive layer 8 and preferably comprises one of platinum, ruthenium, rhodium, osmium, iridium, zirconium, vanadium, tantalum, chromium, molybdenum, tungsten, carbides, tungsten carbide, titanium carbide, silicon carbide, silicon, nitrides, titanium nitride and tantalum nitride.

In contrast to the examples in FIGS. 2A to 2C and 3, in the example in accordance with FIG. 4, proceeding from a semiconductor wafer as already described with reference to FIG. 2A, the transmissive layer 8 itself is modified within the separating region 2. In this case, the modification takes place such that the absorption coefficient is increased locally within the separating region 2. Such a modification can be effected, for example, by introducing scattering centers, implanting impurities and/or wet-chemical reactions.

Our methods and semiconductor bodies are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A method of producing a semiconductor body comprising:
   providing a semiconductor wafer having at least two chip regions and at least one separating region arranged between the chip regions, wherein the semiconductor wafer comprises a layer sequence, an outermost layer of which has, at least within the separating region a transmissive layer transmissive to electromagnetic radiation,
   removing the transmissive layer locally in the separating region and in the chip regions such that in each case at least one opening arises in the transmissive layer within the separating region and within the chip regions,
   prior to separating the chip regions, arranging a metallic layer in the openings of the transmissive layer, and
   separating the chip regions along the separating regions by a laser.

2. The method according to claim 1, wherein the layer sequence has within the chip regions an active zone that generates electromagnetic radiation, and the separating region completely penetrates through the active zone.

3. The method according to claim 1, wherein the transmissive layer is a passivation layer.

4. The method according to claim 1, wherein the transmissive layer comprises one of oxides and nitrides.

5. The method according to claim 1, wherein thickness of the transmissive layer is 3 nm to 500 nm.

6. The method according to claim 1, wherein the transmissive layer completely covers side faces of the chip regions.

7. The method according to claim 1, wherein the transmissive layer is removed within the separating region by an etching process.

8. The method according to claim 1, wherein the metallic layer in the openings of the chip regions is provided as an electrical contact of the respective semiconductor body.

9. The method according to claim 1, wherein an absorbent layer is applied within the separation region and the absorbent layer on the transmissive layer comprises one of: platinum, ruthenium, rhodium, osmium, indium, zirconium, vanadium, tantalum, chromium, molybdenum, tungsten, carbides, tungsten carbide, titanium carbide, silicon carbide, silicon, nitrides, titanium nitride and tantalum nitride.

10. The method according to claim 1, wherein each chip region has an optoelectronic thin-film semiconductor body.

11. The method according to claim 1, wherein the separating region is a sawing trench.

* * * * *